US 6,706,409 B2

(12) United States Patent
Takano et al.

(10) Patent No.: US 6,706,409 B2
(45) Date of Patent: Mar. 16, 2004

(54) INCOMBUSTIBLE RESIN COMPOSITION, PREPREG, LAMINATED PLATE, METAL-CLAD LAMINATED PLATE, PRINTED WIRING BOARD AND MULTI-LAYER PRINTED WIRING BOARD

(75) Inventors: Nozomu Takano, Ibaraki-ken (JP); Tomio Fukuda, Ibaraki-ken (JP); Masato Miyatake, Ibaraki-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/973,719

(22) Filed: Oct. 11, 2001

(65) Prior Publication Data

US 2002/0068173 A1 Jun. 6, 2002

(30) Foreign Application Priority Data

Oct. 13, 2000 (JP) ........................................ 2000/313720

(51) Int. Cl.⁷ .......................... B32B 27/04; B32B 27/20; C08L 83/04
(52) U.S. Cl. ........................ 428/450; 428/413; 428/414; 428/416; 428/447; 428/448; 428/473.5; 428/502; 428/901; 528/12; 528/33; 528/43; 524/436; 524/437; 525/474; 525/476
(58) Field of Search ............................... 428/413, 414, 428/416, 447, 448, 450, 473.5, 502, 504, 901; 528/12, 33, 43; 524/436, 437; 525/474, 476

(56) References Cited

U.S. PATENT DOCUMENTS

| 4,666,765 A | * | 5/1987 | Caldwell et al. ............... 442/85 |
| 4,714,650 A | * | 12/1987 | Obayashi et al. ............. 442/93 |
| 4,731,406 A | | 3/1988 | Itoh et al. |
| 6,130,282 A | | 10/2000 | Imahashi et al. |
| 6,277,908 B1 | * | 8/2001 | Yamamoto ................... 524/436 |
| 6,280,839 B1 | | 8/2001 | Brown et al. |
| 6,303,681 B1 | | 10/2001 | Furukawa et al. |
| 2001/0053447 A1 | * | 12/2001 | Takano et al. ............... 428/429 |

FOREIGN PATENT DOCUMENTS

| EP | 0906933 | | 4/1999 | |
| EP | 0960855 | | 12/1999 | |
| EP | 1092751 | | 4/2001 | |
| JP | 11124489 | | 5/1999 | |
| JP | 11181243 | | 7/1999 | |
| JP | 11181305 | | 7/1999 | |
| JP | 11181380 | | 7/1999 | |
| JP | 11199753 | | 7/1999 | |
| JP | 11217467 | | 8/1999 | |
| WO | WO 97/01595 | * | 1/1997 | ............... C08J/5/24 |

OTHER PUBLICATIONS

Hackh's Chemical Dictionary, Fourth Edition, 1969, p. 473.*
English Language Abstract of JP 11–124489.
English Language Abstract of JP 11–199753.
English Language Abstract of JP 11–181243.
English Language Abstract of JP 11–181305.
English Language Abstract of JP 11–181380.
English Language Abstract of JP 11–217467.

* cited by examiner

*Primary Examiner*—Robert Dawson
*Assistant Examiner*—Michael J Feely
(74) *Attorney, Agent, or Firm*—Greenblum & Bernstein, P.L.C.

(57) ABSTRACT

An incombustible resin composition in which a silicone oligomer, a metal hydrate and a resin material are contained as essential components, the metal hydrate is 20% by weight or more in the total solids of the resin composition is provided.

16 Claims, No Drawings

INCOMBUSTIBLE RESIN COMPOSITION, PREPREG, LAMINATED PLATE, METAL-CLAD LAMINATED PLATE, PRINTED WIRING BOARD AND MULTI-LAYER PRINTED WIRING BOARD

BACKGROUND OF THE INVENTION

1. Field of the Invention

The present invention relates to an incombustible resin composition, and a prepreg, a laminated plate, a metal-clad laminated plate, a printed wiring board and a multi-layer printed wiring board using the same, which are suitably used for a variety of electronic materials.

2. Description of the Related Art

Upon most of resin compositions used for a variety of electronic devices, incombustibility is conferred in order to secure the safety involving with fire. In order to make the resin compositions incombustible, a variety of methods have been employed, and bromine compounds have been widely used because of their excellent incombustibility.

However, there is a possibility that the bromine compounds may form a compound having a high toxicity. Moreover, since people become highly conscious about the environmental destructive problems on a global scale, incombustible systems in place of bromine compound being considered.

On the other hand, as a soldering material of mounted parts, conventionally Sn—Pb based soldering materials have been mainly used. Since these may pollute the soil at the time of processing disposables, a soldering material without using Pb is considered. When analyzing the reports concerned with soldering materials free from Pb, the melting point rises, and therefore it is conceivable that the reflow temperature would also rise.

Under such circumstances, for resin compositions used for electronic materials from now on, where bromine compounds are not used, and at the same time, a higher heat-resistance than those of resin compositions made so far is required.

As a method of making materials incombustible in place of bromine compounds, conventionally, an addition of phosphorous and nitrogenous compounds and an introduction of these into the resin skeletons have been performed. These have been disclosed, for example, in Japanese Patent Application (Japanese Patent Application Laid-Open No. Hei 11-124489) filed on Oct. 22, 1997 and Japanese Patent Application (Japanese Patent Application Laid-Open No. Hei 11-199753) filed on Jan. 5, 1998. In order to secure the incombustibility using phosphorus and nitrogen, these are required to some extent to be blended.

However, when these are blended so that incombustibility can be secured, there have been problems such as the increase in the water absorption rate, the decrease in heat resistance, and the like occur.

As a method of making the material incombustible in which the volume of introduction of phosphorus and nitrogen are reduced, there is a method of using metal hydrates.

For example, in Japanese Patent Application (Japanese Patent Application Laid-Open No. Hei 11-181243) filed on the date of Dec. 18, 1997, a technology of making the material incombustible using hydration alumina has been disclosed.

However, since metal hydrates trap water having the cooling effect at the time of burning, there has been a problem that when the volumes of these are blended to some extent, the heat resistance is rapidly lowered.

The reason for the heat resistances decreasing when the metal hydrates are used is that the temperature at which the metal hydrates release water is lower than the melting temperature of the soldering.

This tendency is considered to be more significant in the case of the soldering being free from Pb whose melting temperature is expected to rise to a higher point.

As a method of enhancing the heat resistance using metal hydrates, a method of using magnesium hydroxide whose temperature of releasing water is comparatively high (approximately 340° C.) has been disclosed in Japanese Patent Application (Japanese Patent Application Laid-Open No. Hei 11-181305) filed on Jul. 6, 1999.

However, there has been a problem that magnesium hydroxide is inferior from the viewpoint of the acid resistance. Moreover, a method of performing silane processing with silane compound monomer to the surface of the metal hydrate for the purpose of enhancing dispersion of the metal hydrate, the tensile strength, the elongation has been disclosed in Japanese Patent Application (Japanese Patent Application Laid-Open No. Hei 11-181380) filed on Jul. 6, 1999 and Japanese Patent Application (Japanese Patent Application Laid-Open No. Hei 11-217467) filed on Feb. 3, 1998.

However, as for the silane compound monomer, the enhancement of the heat resistance of the metal hydrate was not recognized because it is also accompanied with the facts that the heat resistance of the monomer itself is low and the processing efficiency to the surface of the metal hydrate is low.

SUMMARY OF THE INVENTION

An object of the present invention is to provide an incombustible resin composition, a laminated plate and a printed wiring board, where heat resistance is high and which does not require the bromine compounds.

One aspect of the present invention provides an incombustible resin composition, which comprises a silicon oligomer, a metal hydrate and a resin material as essential components, wherein the metal hydrate is at least 20% by weight in the total solids of the resin composition.

The term "total solids" as used herein relates to inorganic filler, resins, and hardening agents and hardening accelerators arbitrarily selected.

Another aspect of the present invention provides an incombustible composition containing at least one species of resin material selected from the group consisting of an epoxy resin, a polyimide resin, a triazine resin, a phenol resin, a melamine resin and the denatured resins denaturing these resins.

Further, the present invention provides an incombustible resin composition where the metal hydrate has a surface processed with a silicone oligomer.

Further, the present invention provides an incombustible resin composition containing aluminium hydroxide as the metal hydrate.

Further, the present invention provides an incombustible resin composition where the average particle diameter of aluminium hydroxide is 5 μm or less.

Further, the present invention provides an incombustible resin composition containing magnesium hydroxide as a metal hydrate.

Further, the present invention provides an incombustible resin composition containing calcium hydroxide as a metal hydrate.

Further, the present invention provides an incombustible resin composition where the end of the silicone oligomer has a silanol group capable of reacting with the surface of the metal hydrate.

Further, the present invention provides an incombustible resin composition where which the degree of polymerization of silicon oligomer is 2 to 7000.

Further, the present invention provides an incombustible resin composition where the silicone oligomer contains aromatic group.

Further, the present invention provides an incombustible resin composition where each siloxane unit of the silicone oligomer contains one aromatic group or more, respectively.

Further, the present invention provides a prepreg manufactured by utilizing an incombustible resin composition, a laminated plate manufactured by utilizing the prepreg, a metal-clad laminated plate manufactured by utilizing the laminated plate and a printed wiring board prepared by utilizing the metal-clad laminated plate.

Another aspect of the present invention provides a method for preparing an incombustible resin composition, which comprises: a metal hydrate is mixed into a processing solution containing a silicone oligomer; and then other resin components are mixed into the solution.

Further, the present invention provides an incombustible resin composition using aluminium hydroxide as a metal hydrate.

By utilizing an incombustible resin composition of the present invention, a prepreg, a laminated plate, a copper-clad laminated plate, a printed wiring board and a multi-layer wiring board, which has been desired in recent years, has an excellent incombustibility without using bromine and realizes a high heat resistance can be prepared.

The present disclosure relates to subject matter contained in Japanese Patent Application No.2000-313720, filed on Oct. 13, 2000, the disclosure of which is expressly incorporated herein by reference in its entirety.

DETAILED DESCRIPTION OF THE INVENTION

The present invention relates to an incombustible resin composition, a laminated plate, a printed wiring board using the composition containing a metal hydrate and silicone oligomer but not containing bromine compounds. Hereinafter, the present invention will be described below.

A metal hydrate of the invention includes, but not limited to aluminum hydroxide, magnesium hydroxide and calcium hydroxide which are conventionally used in incombustible resin compositions and known.

Considering the heat resistance, incombustibility and dispersion property of particle, it is preferable that the average particle diameter of the metal hydroxide is 10 $\mu$m or less. Moreover, if aluminium hydroxide is used as a metal hydrate, it is particularly preferable to use aluminium hydroxide whose average diameter of the particle is 5 $\mu$m or less since its temperature of releasing water and the heat resistance are high. As for the minimum value of the particle diameter, it is not particularly limited since it is dependent upon its grain size distribution, but it is preferable that it is 0.5 $\mu$m or more. In the case where it is less than 0.5 $\mu$m, the viscosity is high at the time of varnishing and the lowering of fluidity of the resin is significant.

Moreover, these metal hydrates and the other inorganic fillers can be used in combination. The kinds and shapes of inorganic fillers which are used in combination with the metal hydrates are not particularly limited, for example, calcium carbonate, alumina, titanium oxide, mica, aluminium carbonate, magnesium silicate, aluminium silicate, silica and a variety of kinds of whiskers such as glass short fibers, aluminium borate and silicon carbide are used. Furthermore, a few kinds of these may be used in combination.

A blending volume of the inorganic filler is preferably 20 to 80% by weight with respect to the total solids of the resin composition. Among these, the metal hydrate is 20% by weight or more with respect to the total solids of the resin composition.

A silicone oligomer in the present invention contains at least one kind selected from bifunctional siloxane unit ($R_2SiO_{2/2}$), trifunctional siloxane unit ($RSiO_{3/2}$) (in the formula, R represents organic group, R groups in silicone oligomer may be identical with each other or different.), and tetrafunctional siloxane unit ($SiO_{4/2}$). Moreover the silicone oligomer has one functional group or more which reacts with hydroxyl group at the end of it.

It is preferable that the degree of polymerization is 2 to 7000, more preferably 2 to 100, particularly preferable degree of polymerization is 2 to 70.

The degree of the polymerization is calculated from the number average molecular weight measured by utilizing calibration curve of the standard polystyrene or polyethylene glycol by its polymer molecular weight (in the case of low degree of polymerization) or gel permeation chromatography.

As the R, an alkyl group having 1 to 4 of carbon atoms or an aromatic group such as phenyl group is preferable selected. However, in order to further enhance the heat resistance, it is more preferable that the ratio of aromatic groups is raised. It is particularly preferable that the respective siloxane unit of the silicone oligomer contains one aromatic group or more, respectively, and it is particularly preferable that it contains phenyl group.

As the functional group reacting with hydroxyl group, silanol group, alkoxyl group having 1 to 4 pieces of carbon atoms, acyloxy group having 1 to 4 pieces of carbon atoms, halogen such as chlorine or the like except for bromine are listed.

A silicone oligomer of the invention can be obtained by hydrolyzing and performing the polycondensation of silane compound represented by the following general formula (I).

In the formula, X represents halogen such as chlorine except for bromine or —OR, where R represents alkyl group having 1 to 4 of carbon atoms or alkyl carbonyl group having 1 to 4 of carbon atoms, R' represents organic groups such as alkyl group having 1 to 4 of carbon atoms or phenyl group, n denotes an integer of 0 to 2).

Silane compounds represented by the general formula (I) are concretely, 4 functionality silane compounds (hereinafter, functionality in silane compound means that it has functional group having condensation reaction) such as follows:

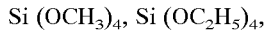
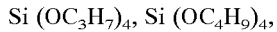

monoalkyl trialkoxy silanes such as follows:

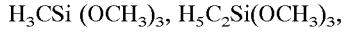
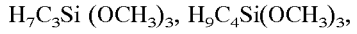
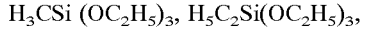

$H_7C_3Si(OC_2H_5)_3$, $H_9C_4Si(OC_2H_5)_3$,
$H_3CSi(OC_3H_7)_3$, $H_5C_2Si(OC_3H_7)_3$,
$H_7C_3Si(OC_3H_7)_3$, $H_9C_4Si(OC_3H_7)_3$,
$H_3CSi(OC_4H_9)_3$, $H_5C_2Si(OC_4H_9)_3$,
$H_7C_3Si(OC_4H_9)_3$, $H_9C_4Si(OC_4H_9)_3$,
phenyl trialkoxy silanes such as follows:
$PhSi(OCH_3)_3$, $PhSi(.C_2H_5)_3$,
$PhSi(OC_3H_7)_3$, $PhSi(OC_4H_9)_3$,
(where Ph represents phenyl group. Hereinafter, referred to as the same as it is represented)
monoalkyl triacyloxy silanes such as follows:
$(H_3CCOO)_3SiCH_3$, $(H_3CCOO)_3SiC2H_5$,
$(H_3CCOO)_3SiC3H_7$, $(H_3CCOO)_3SiC_4H_9$,
trifunctional silane compounds such as monoalkyl trihalogeno silanes such as follows:
$Cl_3SiCH_3$, $Cl_3SiC_2H_5$,
$Cl_3SiC_3H_7$, $Cl_3SiC_4H_9$,
dialkyl dialkoxy silanes such as follows:
$(H_3C)_2Si(OCH_3)_2$, $(H_5C_2)_2Si(OCH_3)_2$,
$(H_7C)_3Si(OCH_3)_2$, $(H_9C_4)_2Si(OCH_3)_2$,
$(H_3C)_2Si(OC_2H_5)_2$, $(H_5C_2)_2Si(OC_2H_5)_2$,
$(H_7C)_3Si(OC_2H_5)_2$, $(H_9C_4)_2Si(OC_2H_5)_2$,
$(H_3C)_2Si(OC_3H_7)_2$, $(H_5C_2)_2Si(OC_3H_7)_2$,
$(H_7C)_3Si(OC_3H_7)_2$, $(H_9C_4)_2Si(OC_3H_7)_2$,
$(H_3C)_2Si(OC_4H_9)_2$, $(H_5C_2)_2Si(OC_4H_9)_2$,
$(H_7C_3)_2Si(OC_4H_9)_2$, $(H_9C_4)_2Si(OC_4H_9)_2$,
diphenyl dialkoxy silanes such as follows:
$Ph_2Si(OCH_3)_2$, $Ph_2Si(OC_2H_5)_2$,
dialkyl dialkoxy silanes such follows:
$(H_3CCOO)_2Si(CH_3)_2$, $(H_3CCOO)_2Si(C_2H_5)_2$,
$(H_3CCOO)_3Si(C_3H_7)_2$, $(H_3CCOO)_2Si(C_4H_9)_2$, and
bifunctional silane compounds such as alkyl dihalogeno silanes such as follows:
$Cl_2Si(CH_3)_2$, $Cl_2Si(C_2H_5)_2$,
$Cl_2Si(C_3H_7)_3$, $Cl_2Si(C_4H_9)_2$, As a silane compound represented by the general formula (I) of the present invention, any of tetrafunctional silane compound, trifunctional silane compound, bifunctionality silane compound or their mixture is appropriately used.

In order to enhance the heat resistance, it is preferable to use silane compound having an aromatic group. It is particularly preferable to use phenyl trialkoxy silane compound having a phenyl group and diphenyl dialkoxy silane compound.

As a usage volume of the compound having a phenyl group, it is preferable that it is used at the ratio of 5 to 100 mole % with respect to the total silane compound. It is particularly preferable to use it at the ratio of 50 to 100 mole %.

A silicone oligomer in the present invention is manufactured by hydrolyzing and performing the polycondensation of silane compound represented by the general formula (I).

As a catalyst used at this time, it is preferable that: inorganic acids such as hydrochloric acid, sulfuric acid, phosphoric acid, nitric acid and fluoric acid; and organic acids such as oxalic acid, maleic acid, sulfonic acid and formic acid, but basic catalysts such as ammonia and trimethyl ammonium can be also utilized.

As to these catalysts, the appropriate volume is used according to the volume of the silane compound represented by the general formula (I). However, it is preferably used in the range of 0.001 to 1.0 mole with respect to 1 mole of the silane compound represented by the general formula (I).

Moreover, at the time of this reaction, water may exist. The volume of water is also appropriately determined. If water is too much, the conservation stability of the coating liquid will be lowered. Therefore, as for the volume of water, it is preferably 0 to 5 moles with respect to 1 mole of hydrolytic group (for example, alkoxyl group) that the silane compound represented by the general formula (I) has. It is more preferably in the range of 0.5 to 2 moles.

Moreover, it is preferable that the above-described hydrolysis and polycondensation are performed in the solvent. As a solvent, it is not particularly limited. Silicone oligomer is obtained by appropriately blending and agitating silane compound, catalyst, water and solvent. At this time, the concentration of the silane compound, the temperature of reaction, the reaction time period and the like are not particularly limited.

These silicone oligomers covers the surface of the metal hydrate and enhances the temperature at which the metal hydrate releases the water held by itself. Usually, the temperature at which the metal hydrate releases water, can be measured by loss on heating method, differential scanning calorimeter or thermal decomposition gas chromatography from the metal hydrate. The temperatures at which it releases water are largely different depending upon the kinds, shapes and the like of the metal hydrates. If aluminium hydroxide is used as a metal hydrate, by processing with the above-described silicone oligomer, the temperature becomes higher by a few ° C. to a few of tens ° C.

As for the volume of silicone oligomer, it is preferably 0.01–20 parts by weight, more preferably 0.1–10 parts by weight with respect to 100 parts by weight of inorganic filler considering heat-resistance of the resin composition of the invention.

Moreover, in the present invention, a variety of coupling agents or the like besides silicone oligomers may be used in combination. As a coupling agent, silane based coupling agent, titanate based coupling agent and the like are listed.

As a silane based coupling agent, in general, epoxy silane based coupling agent, amino silane based coupling agent, cationic silane based coupling agent, vinyl silane based coupling agent, acryl silane based coupling agent, melcapto silane based coupling agent, their composite based coupling agent and the like are listed.

The blending ratios in the cases of using these coupling agents in combination are not particularly limited but, it is preferable that the weight ratio of the coupling agent and the silicone oligomer is made in the range of 0.001:1 to 1:0.001. Moreover, it is particularly preferable that it is made in the range of 0.001:1 to 1:1.

The resin material used in the present invention is not particularly limited, but provided that it does not contain bromine. As a resin material, for example, an epoxy resin, a polyimide resin, a triazine resin, a phenol resin, a melamine resin, their denatured substances of these resins and the like are used.

Moreover, as to these resins, two kinds of these may be used in combination, a variety of hardening agents, hardening accelerators and the like may be added according to the necessity, and these may be also blended as solvent solution.

The blending volume is determined by the ratio with respect to the volume of inorganic filler containing a metal hydrate. It is preferable that the total blending volume of the hardening agent and hardening accelerator used according to the resin and the necessity is in the range of 20% by weight to 80% by weight of the total solids of the resin composition.

Considering the balance of properties such as the heat resistance, the moisture resistance, the cost and the like, it is preferable to use an epoxy resin.

As an epoxy resin, for example, a bisphenol type epoxy resin, a novolak type epoxy resin, an aliphatic chain epoxy resin, epoxidation polybutadien, an glycidyl ester type epoxy resin, a glycidyl amine type epoxy resin and the like are preferably used, and bisphenol type epoxy resins such as a bisphenol A type epoxy resin, a bisphenol F type epoxy resin, a bisphenol S type epoxy resin and the like, and novolak type epoxy resins such as a cresol novolak type epoxy resin, a bisphenol A novolak type epoxy resin, a salicylaldehyde phenol novolak type epoxy resin and the like are more preferably used. From the viewpoint of enhancing the heat resistance, it is particularly preferable that a bisphenol A novolak type epoxy resin, a cresol novolak type epoxy resin or a salicylaldehyde phenol novolak type epoxy resion is used. These resins may be singly used or two kinds or more of these resins may be used in combination.

As a hardening agent, a variety of conventionally known kinds can be used. For example, if an epoxy resin is used as a resin, a hardening agent for use is, for example, multifunctional phenol such as dicyandiamide, diaminodiphenylmethane, diaminodiphenyl sulfone, phthalic anhydride, pyromellitic anhydride, phenol novolak and cresol novolak. For these hardening agents, several kinds of these can be also used in combination.

The kinds of hardening accelerators and blending volumes are not particularly limited, for example, imidazole based compound, organic phosphorus based compound, the tertiary amine, the quaternary ammonium salt are used or the two kinds or more of these may be used in combination.

The solvent is often used in order to dilute these resin materials, metal hydrates, silicone oligomers and the like to be varnished. This solvent is not particularly limited, but, for example, acetone, methyl ethyl ketone, toluene, xylene, methyl isobutyl ketone, ethyl acetate, ethylene glycol mono methyl ether, N, N-dimethyl formamide, methanol and ethanol are listed. These solvents may be used singly or may be blended with several kinds.

Moreover, the solid concentration of varnish is not limited, and can be appropriately changed depending upon the resin compositions, inorganic fillers, the blending volume and the like. However, it is preferable that it is in the range of 50% by weight to 85% by weight. When the solid is lower than 50% by weight, there is a tendency that the varnish viscosity is lower and the resin portion of the prepreg is too low. Moreover, if the solid is higher than 85% by weight, there is a tendency that the appearance of the prepreg, and the like are significantly lowered due to the increased viscosity of the varnish and the like.

The methods of processing the surface of the metal hydrate at the time of varnishing are not particularly limited: the metal hydrate in which the above-described silicone oligomer has been previously processed may be used; a silicone oligomer may be blended with a resin and a metal hydrate at the time of varnishing; or the varnishing may be performed as it is after the metal hydrate is inputted into the processing liquid into which the silicone oligomer and the like have been previously inputted and the agitation processing has been carried out.

A prepreg for a printed wiring board is obtained by blending the respective components to obtain a vanish, impregnating obtained varnish into the base material and drying in the range of 80° C. to 20° C. in the drying furnace.

As a base material, if it is used at the time of manufacturing metal foil-clad laminated plate and multi to layer printed wiring board, it is not particularly limited, but usually fiber base materials such as a woven fabric and a nonwoven fabric are used.

As a fiber base material, for example, inorganic fibers such as glass, alumina, asbestos, boron, silica alumina glass, silica glass, Si—Ti—C—O fiber reinforced SiC {chirano fiber}, silicon carbide, silicon nitride, zirconium, and organic fibers such as aramid, polyether ether ketone, polyether imide, polyether sulfone, carbon, cellulose and the like are listed. These may be used singly or the two kinds or more of these may be used in combination. As a fiber base material, the woven fabric of glass fiber is particularly preferable.

A laminated plate can be prepared by lapping sheets of the prepreg according to the thickness of the laminated plate to be manufactured, and thus obtained. It may be used along with the other prepreg in combination. Considering that the laminated surface contacts with the flame, it is preferable that a prepreg of the present invention with incombustibility is applied to the surface layer.

A metal-clad laminated plate is manufactured by lapping a metal foil on the prepreg, heating and pressurizing at 150° C. to 200° C., in the range of 1.0 MPa–8.0 MPa. As a metal foil, it is not particularly limited, but the copper foil is preferably used from the electrical and economical viewpoints.

A printed wiring board can be obtained by using a method usually used such as a subtract method, perforating and the like.

A prepreg, a metal laminated plate and a printed wiring board of the present invention can be used as a material of multi-layer wiring board.

According to the present invention, a laminated plate is manufactured by employing a metal hydrate and a silicone oligomer in combination, an incombustibility can be manifested though bromine compound is not used, and the decreasing in the heat resistance occurred by blending a metal hydrate is capable of being suppressed.

Hereinafter, examples of the present invention will be described.

EXAMPLE 1

40 g of tetramethoxy silane and 93 g of methanol were blended in a glass flask equipped with an agitator, a condenser and a thermometer to obtain a solution.

To the obtained solution, 0.47 g of acetic acid and 18.9 g of distilled water were added and stirred at 50° C. for 8 hours to synthesize a silicone oligomer. The average degree of polymerization of the obtained silicone oligomer was 20.

It should be noted that the average degree of polymerization was calculated from the number average molecular weight measured by utilizing the calibration curve of standard polystyrene by gel permeation chromatography.

To the obtained oligomer, methylethyl ketone was added to prepare a silicon oligomer solution having 25% by weight of solids.

As indicated below, a resin, a hardening agent, a hardening accelerator, a metal hydrate and a silicone oligomer were blended to the obtained silicone oligomer solution, and then methylethyl ketone was added to prepare a varnish having 70% by weight of solids.

| | |
|---|---|
| Bisphenol A type epoxy resin(Ep1001 made by Oil Chemical Shell Epoxy, Co., Ltd.; epoxy equivalent: 466) | 30 parts by weight |
| Orthocresol novolak type epoxy resin(ESCN-195 | 70 parts by weight |

-continued

| | |
|---|---|
| made by Sumitomo Chemical, Co., Ltd.; epoxy equivalent: 195) | |
| Dicyan diamide | 5 parts by weight |
| 2-ethyl-4-methyl imidazole | 0.5 parts by weight |
| alminium hydroxide (CL310 made by Sumitomo Chemical, Co., Ltd.) | 155 parts by weight |
| Silicone oligomer solution (25% by weight) | 4 parts by weight |

EXAMPLE 2

As similarly to Example 1, 40 g of trimethoxymethyl silane and 93 g of methanol were blended to obtain a solution. To the obtained solution, 0.53 g of acetic acid and 15.8 g of distilled water were added and then stirred at 50° C. for 8 hours to synthesize a silicone oligomer. The average degree of polymerization of the obtained oligomer was 15. To the obtained oligomer, methylethyl ketone was added to prepare a silicone oligomer solution having the 25% by weight of solids. A varnish was prepared similarly to Example 1, by employing the obtained silicone oligomer solution.

EXAMPLE 3

As similarly to Example 1, 20 g of dimethoxydimethyl silane, 25 g of tetramethoxy silane and 105 g of methanol were blended to obtain a solution. To the obtained solution, 0.60 g of acetic acid and 17.8 g of distilled water were added and stirred at 50° C. for 8 hours to synthesize a silicone oligomer. The average degree of the polymerization of the obtained oligomer was 30. To the obtained oligomer, methylethyl ketone was added to prepare a silicone oligomer solution having the 25% by weight of solids. A varnish was prepared similarly to Example 1, by employing the obtained silicone oligomer solution.

EXAMPLE 4

As similarly to Example 1, 20 g of trimethoxymethyl silane, 22 g of tetramethoxysilane and 93 g of methanol were blended to obtain a solution. To the obtained solution, 0.52 g of acetic acid and 18.3 g of distilled water were added and then stirred at 50° C. for 8 hours to synthesize a silicone oligomer. The average degree of polymerization of the obtained oligomer was 25. To the obtained oligomer, methylethyl ketone was added to prepare a silicone oligomer solution having 25% by weight by solids. A varnish was prepared similarly to Example 1, by employing the obtained silicone oligomer solution. ned silicone oligomer solution.

EXAMPLE 5

As similarly to Example 1, 10 g of dimethoxdimethyl silane, 10 g of trimethoxymethyl silane, 20 g of tetramethoxy silane and 93 g of methanol were blended to obtain a solution. To the obtained solution, 0.52 g of acetic acid and 16.5 g of distilled water were added and then stirred at 50° C. for 8 hours to synthesize a silicone oligomer. The average degree of polymerization of the obtained oligomer was 23. To the obtained oligomer, methylethyl ketone was added to prepare a silicone oligomer solution having 25% by weight of solids. A varnish was prepared similarly to Example 1, by employing the obtained silicone oligomer solution.

EXAMPLE 6

As similarly to Example 1, 40 g of tetraethoxy silane and 93 g of methanol were blended to obtain a solution. To the obtained solution, 0.34 g of acetic acid and 13.8 g of distilled water were added and then stirred at 50° C. for 8 hours to synthesize a silicone oligomer. The average degree of polymerization of the obtained oligomer was 19. To the obtained oligomer, methylethyl ketone was added to prepare a silicone oligomer solution having 25% by weight of solids. A varnish was prepared similarly to Example 1, by employing the obtained silicone oligomer solution.

EXAMPLE 7

As similarly to Example 1, 40 g of diphenyldimethoxy silane and 10 g of methanol were blended to obtain a solution. To the obtained solution, 0.20 g of acetic acid and 6.0 g of distilled water were added and then stirred at 25° C. for 1 hour to synthesize a silicone oligomer. The average degree of polymerization of the obtained oligomer was 2. To the obtained oligomer, methylethyl ketone was added to prepare a silicone oligomer solution having 25% by weight of solids. A varnish was prepared similarly to Example 1, by employing the obtained silicone oligomer solution.

EXAMPLE 8

As similarly to Example 1, 40 g of diphenyldimethoxy silane and 10 g of methanol were blended to obtain a solution. To the obtained solution, 0.20 g of acetic acid and 6.0 g of distilled water were added and then stirred at 50° C. for 8 hour to synthesize a silicone oligomer. The average degree of polymerization of the obtained oligomer was 8. To the obtained oligomer, methylethyl ketone was added to prepare a silicone oligomer solution having 25% by weight of solids. A varnish was prepared similarly to Example 1, by employing the obtained silicone oligomer solution.

EXAMPLE 9

As similarly to Example 1, 40 g of phenyltrimethoxy silane and 10 g of methanol were blended to obtain a solution. To the obtained solution, 0.24 g of acetic acid and 11.0 g of distilled water were added and then stirred at 50° C. for 8 hour to synthesize a silicone oligomer. The average degree of polymerization of the obtained oligomer was 12. To the obtained oligomer, methylethyl ketone was added to prepare a silicone oligomer solution having 25% by weight of solids. A varnish was prepared similarly to Example 1, by employing the obtained silicone oligomer solution.

EXAMPLE 10

As similarly to Example 1, 40 g of diphenyltrimethoxy silane and 10 g of methanol were blended to obtain a solution. To the obtained solution, 0.18 g of acetic acid and 5.5 g of distilled water were added and then stirred at 50° C. for 8 hour to synthesize a silicone oligomer. The average degree of polymerization of the obtained oligomer was 10. To the obtained oligomer, methylethyl ketone was added to prepare a silicone oligomer solution having 25% by weight of solids. A varnish was prepared similarly to Example 1, by employing the obtained silicone oligomer solution.

EXAMPLE 11

As similarly to Example 1, 40 g of phenyltriethoxy silane and 10 g of methanol were blended to obtain a solution. To the obtained solution, 0.20 g of acetic acid and 9.0 g of distilled water were added and then stirred at 50° C. for 8 hour to synthesize a silicone oligomer. The average degree of polymerization of the obtained oligomer was 9. To the obtained oligomer, methylethyl ketone was added to prepare a silicone oligomer solution having 25% by weight by solids. A varnish was prepared similarly to Example 1, by employing the obtained silicone oligomer solution.

EXAMPLE 12

As similarly to Example 1, 20 g of diphenyldimethoxy silane, 20 g of tetramethoxy silane and 10 g of methanol were blended to obtain a solution. To the obtained solution, 0.25 g of acetic acid and 12.5 g of distilled water were added and then stirred at 50° C. for 8 hour to synthesize a silicone oligomer. The average degree of polymerization of the obtained oligomer was 15. To the obtained oligomer, methylethyl ketone was added to prepare a silicone oligomer solution having 25% by weight of solids. A varnish was prepared similarly to Example 1, by employing the obtained silicone oligomer solution.

EXAMPLE 13

As similarly to Example 1, 20 g of diphenyldimethoxy silane, 20 g of dimethoxydimethyl silane and 10 g of methanol were blended to obtain a solution. To the obtained solution, 0.28 g of acetic acid and 9.0 g of distilled water were added and then stirred at 50° C. for 8 hour to synthesize a silicone oligomer. The average degree of polymerization of the obtained oligomer was 8. To the obtained oligomer, methylethyl ketone was added to prepare a silicone oligomer solution having 25% by weight of solids. A varnish was prepared similarly to Example 1, by employing the obtained silicone oligomer solution.

EXAMPLE 14

As similarly to Example 1, 20 g of diphenyldimethoxy silane, 20 g of trimethoxymethyl silane and 10 g of methanol were blended to obtain a solution. To the obtained solution, 0.25 g of acetic acid and 11.0 g of distilled water were added and then stirred at 50° C. for 8 hour to synthesize a silicone oligomer. The average degree of polymerization of the obtained oligomer was 10. To the obtained oligomer, methylethyl ketone was added to prepare a silicone oligomer solution having 25% by weight of solids. A varnish was prepared similarly to Example 1, by employing the obtained silicone oligomer solution.

EXAMPLE 15

As similarly to Example 1, 20 g of diphenyldimethoxy silane, 20 g of phenyltrimethoxy silane and 10 g of methanol were blended to obtain a solution. To the obtained solution, 0.30 g of acetic acid and 5.9 g of distilled water were added and then stirred at 50° C. for 8 hour to synthesize a silicone oligomer. The average degree of polymerization of the obtained oligomer was 6. To the obtained oligomer, methylethyl ketone was added to prepare a silicone oligomer solution having 25% by weight of solids. A varnish was prepared similarly to Example 1, by employing the obtained silicone oligomer solution.

EXAMPLE 16

To the silicone oligomer solution obtained in example 7, γ-glycidoxypropyl trimethoxysilane (trade name: A-187 made by Nippon Unicar, Co., Ltd.) as silane coupling agent and methylethyl ketone were added in the ratio of 50:50 (weight ratio) to prepare a silicone oligomer/silane coupling agent solution having 25% by weight of solids.

A varnish was prepared similarly to Example 1 employing the obtained silicone oligomer/silane coupling agent solution in place of the silicone oligomer solution of Example 1.

EXAMPLE 17

To the silicone oligomer solution obtained in example 7, isopropyl tris (dioctylpyrophosphate)titanate (trade name:KR46B made by Ajinomoto, Co., Inc.) as titanate coupling agents and methylethyl ketone were added, in the ratio of 50:50 (weight ratio) to prepare a silicone oligomer/silane coupling agent solution having 25% by weight of solids.

A varnish was prepared similarly to Example 1 employing the obtained silicone oligomer/silane coupling agent solution in place of the silicone oligomer solution of Example 1.

EXAMPLE 18

A varnish was prepared similarly to Example 7 except that magnesium hydroxide was used in place of aluminium hydroxide as a metal hydrate.

EXAMPLE 19

A varnish was prepared similarly to Example 7 except that calcium hydroxide was used in place of aluminium hydroxide as a metal hydrate.

EXAMPLE 20

A varnish was prepared similarly to Example 7 except that 100 parts by weight of aluminium hydroxide and 55 parts by weight of magnesium hydroxide were used as metal hydrates.

EXAMPLE 21

A varnish was prepared similarly to Example 7 except that 100 parts by weight of orthocresol novolak type epoxy resin as an epoxy resin (ESCN-195 made by Sumitomo Chemical; epoxy equivalent: 195) and 55 parts by weight of phenyl novolak resin (HP-850N made by Hitachi Chemical, Co., Ltd.; hydroxyl group equivalent: 108) in place of dicyandiamide were used.

EXAMPLE 22

A varnish was prepared similarly to Example 7 except that the blending volume of aluminium hydroxide was 230 parts by weight.

EXAMPLE 23

A varnish was prepared similarly to Example 7 except that the blending volume of aluminium hydroxide was 400 parts by weight.

EXAMPLE 24

To the silicone oligomer obtained in the example 7, methanol was added to prepare a silicone oligomer processing solution having 3% by weight of solids. To the obtained processing solution, the same volume of aluminium hydroxide with that of Example 21 was added and stirred at 25° C. for 1 hour, and then dried at 80° C. for 3 hour prepare a silicone oligomer processing aluminium hydroxide. A varnish was prepared similarly to Example 21 by employing the obtained processed aluminium hydroxide.

EXAMPLE 25

To the silicone oligomer obtained in the example 7, methylethyl ketone was added to prepare a silicone oligomer processing solution having 5% by weight of solids. To the obtained processing solution, the same volume of aluminium hydroxide with that of Example 21 was added, stirred at 25° C. for 1 hour to obtain a solution and then employing the solution to prepare a varnish similarly to Example 21.

Comparative Example 1

A varnish was prepared without blending a silicone oligomer solution to the varnish of Example 1.

Comparative Example 2

A varnish was prepared similarly to Example 1 except that 1 part by weight of γ-glycidoxypropyl trimethoxysilane (product name: A-187 made by Nippon Unicar, Co., Ltd.) was used in place of the silicone oligomer of Example 1.

Comparative Example 3

A varnish was prepared similarly to Example 1 except that 1 part by weight of isopropyl tris (dioctylpyro phosphate) titanate (trade name: KR46B made by Ajinomoto, Co., Ltd.) was used in place of the silicone oligomer of Example 1.

Comparative Example 4

A varnish was prepared similarly to Example 7 except that 1 part by weight of diphenyldimethoxy silane compound was blended in place of the silicone oligomer of Example 7.

Comparative Example 5

A varnish was prepared by reducing 155 weight portions of aluminium hydroxide of the varnish in Example 1 to be 20 weight portions of the same.

EXAMPLE 26

Comparative Example 6

The varnishes prepared in the Examples 1–25 and Comparative Examples 1–5 were impregnated into a glass fabric (#2116, E-glass) with a thickness of about 0.1 mm, and then heated and dried at 150° C. for 3–10 minutes, to obtain prepregs having 43% by weight of resin.

Four obtained prepregs were piled and a copper-clad laminated plate with a thickness of 18 μm was placed on both sides on the piled prepregs, and then pressed at 170° C. for 90 minutes at 4.0 MPa to prepare a both sides copper-clad laminated plate respectively.

The obtained plates were evaluated from the viewpoints of the incombustibility and the heat resistance. The results are indicated in Table 1 through Table 4.

The methods of testing are as follows:

Incombustibility: by using a laminated plated on which the whole surface is etched, evaluated by the vertical test in conformity with the UL 94 standards.

Heat resistance: measured the time period until the laminated plate was swollen after the laminated plate floated on the melted solder at 260° C. and 288° C. respectively, using both sides copper-clad laminated plate cut in the size of 50 mm×50 mm.

The swelling of the laminated plate indicates a peeling off the interface between a glass and a resin, a crack or a peeling off between layers of the prepreg tube.

TABLE 1

| Item | | Example 1 | Example 2 | Example 3 | Example 4 | Example 5 | Example 6 | Example 7 | Example 8 |
|---|---|---|---|---|---|---|---|---|---|
| Incombustibility | Maximum | 7.0 | 8.3 | 8.0 | 8.5 | 8.2 | 7.6 | 4.8 | 3.9 |
| (S) | Average | 4.6 | 4.9 | 4.9 | 4.7 | 4.0 | 4.8 | 3.3 | 2.4 |
| Heat resistance | 260° C. | >300 | >300 | >300 | >300 | >300 | >300 | >300 | >300 |
| (S, float) | 288° C. | >300 | >300 | >300 | >300 | >300 | >300 | >300 | >300 |

TABLE 2

| Item | | Example 9 | Example 10 | Example 11 | Example 12 | Example 13 | Example 14 | Example 15 | Example 16 |
|---|---|---|---|---|---|---|---|---|---|
| Incombustibilty | Maximum | 5.0 | 5.1 | 6.0 | 5.5 | 6.5 | 6.0 | 6.3 | 4.9 |
| (S) | Average | 4.2 | 3.0 | 4.3 | 3.9 | 4.5 | 4.1 | 4.2 | 2.8 |
| Heat resistance | 260° C. | >300 | >300 | >300 | >300 | >300 | >300 | >300 | >300 |
| (S, float) | 288° C. | >300 | >300 | >300 | >300 | >300 | >300 | >300 | >300 |

TABLE 3

| Item | | Example 17 | Example 18 | Example 19 | Example 20 | Example 21 | Example 22 | Example 23 | Example 24 | Example 25 |
|---|---|---|---|---|---|---|---|---|---|---|
| Incombustibility | Maximum | 5.0 | 4.0 | 7.5 | 4.3 | 4.1 | 3.0 | 1.5 | 4.6 | 4.1 |
| (S) | Average | 3.0 | 2.2 | 4.9 | 2.9 | 2.8 | 1.5 | 0.5 | 3.0 | 2.6 |
| Heat resistance | 260° C. | >300 | >300 | >300 | >300 | >300 | >300 | >300 | >300 | >300 |
| (S, float) | 288° C. | >300 | >300 | >300 | >300 | >300 | >300 | >300 | >300 | >300 |

TABLE 4

| Item | | Comparative Example 1 | Comparative Example 2 | Comparative Example 3 | Comparative Example 4 | Comparative Example 5 |
|---|---|---|---|---|---|---|
| Incombustibility (S) | Maximum | 15.5 | 13.6 | 14.8 | 11.5 | Burned up |
| | Average | 8.6 | 8.3 | 9.0 | 6.0 | Burned up |
| Heat resistance (S, float) | 260° C. | 150 | 180 | 144 | 193 | >300 |
| | 288° C. | 25 | 47 | 39 | 55 | >300 |

Moreover, regarding with Example 1, the above-described tests were carried out by providing inner layer circuits in the laminated plates, arranging the prepregs prepared similarly to the prepregs on both sides and preparing a multi-layer board.

As a result, it has been confirmed that both of the incombustibility and the heat resistance of the multi-layer board indicate fairly good results comparable to the above-described results.

From the above-described results, it is considered that Examples 1 through 25 achieves the UL 94V-0 standard, and their heat resistances at 260° C. and their heat resistances at 288° C. are fairly good.

It should be understood that the relates to only a preferred embodiment of the invention, and it is intended to cover all changes and modifications of the examples of the invention herein chosen for the purposes of the disclosure, which do not constitute departures from the sprit and scope of the invention.

What is claimed is:

1. An incombustible resin composition comprising a silicone oligomer which comprises an aromatic group, a metal hydrate which comprises aluminum hydroxide, and a resin material, wherein the metal hydrate is 20% by weight or more of the total solids of the resin composition, and wherein the resin material is a resin other than said silicone oligomer.

2. The incombustible resin composition according to claim 1, wherein a resin material is selected from an epoxy resin, a polyimide resin, a triazine resin, a phenol resin, melamine resin and denatured resins denaturing these resins.

3. The incombustible resin composition according to claim 1, wherein the metal hydrate has a surface processed with a silicone oligomer.

4. The incombustible resin composition according to claim 1, wherein the metal hydrate includes magnesium hydroxide.

5. The incombustible resin composition according to claim 1, wherein the metal hydrate includes calcium hydroxide.

6. The incombustible resin composition according to claim 1, wherein an end of the silicone oligomer has a silanol group capable of reacting with a surface of a metal hydrate.

7. The incombustible resin composition according to claim 1, wherein a degree of polymerization of the silicon oligomer is in the range of 2 to 7000.

8. The incombustible resin composition according to claim 1, wherein each siloxane unit of the silicone oligomer has at least one aromatic group.

9. The incombustible resin composition according to claim 1, wherein the aluminum hydroxide has an average particle diameter of 5 μm or less.

10. A prepreg manufactured from the incombustible resin composition according to claim 1.

11. A laminated plate manufactured from the prepreg according to claim 10.

12. A printed wiring board prepared from the laminated plate according to claim 11.

13. A metal-clad laminated plate manufactured from the prepreg according to claim 10.

14. A printed wiring board prepared from the metal-clad laminated plate according to claim 13.

15. A multi-layer printed wiring board prepared from the prepreg according to claim 10.

16. A method for preparing an incombustible resin composition, which comprises: blending a metal hydrate which comprises aluminum hydroxide with a processing liquid containing silicone oligomer which comprises an aromatic group, and then blending other resin components, wherein the other resin components are resins other than said silicone oligomer.

* * * * *